United States Patent
Grenouillet et al.

(10) Patent No.: US 8,603,872 B2
(45) Date of Patent: Dec. 10, 2013

(54) FIELD EFFECT DEVICE PROVIDED WITH A LOCALIZED DOPANT DIFFUSION BARRIER AREA AND FABRICATION METHOD

(75) Inventors: Laurent Grenouillet, Rives (FR); Yannick Le Tiec, Crolles (FR); Nicolas Posseme, Carantec (FR); Maud Vinet, Rives (FR)

(73) Assignee: Commissariat a l'Energie Atomique et aux Energies Alternatives, Paris (FR)

( * ) Notice: Subject to any disclaimer, the term of this patent is extended or adjusted under 35 U.S.C. 154(b) by 0 days.

(21) Appl. No.: 13/356,975

(22) Filed: Jan. 24, 2012

(65) Prior Publication Data
US 2012/0187489 A1   Jul. 26, 2012

(30) Foreign Application Priority Data
Jan. 24, 2011   (FR) ...................... 11 00202

(51) Int. Cl.
*H01L 21/336* (2006.01)

(52) U.S. Cl.
USPC ........... 438/197; 438/285; 438/301; 438/299; 438/303; 257/408; 257/24; 257/25; 257/27; 257/401; 257/E29.242; 257/E21.409

(58) Field of Classification Search
USPC ......... 438/142, 183, 282, 197, 285, 301, 299, 438/303; 257/408, 24, 25, 27, 401
See application file for complete search history.

(56) References Cited

U.S. PATENT DOCUMENTS

| | | | |
|---|---|---|---|
| 6,091,076 A * | 7/2000 | Deleonibus | 257/24 |
| 6,747,326 B2 * | 6/2004 | Tran | 257/408 |
| 7,078,750 B2 * | 7/2006 | Hareland et al. | 257/288 |
| 7,678,635 B2 * | 3/2010 | Clavelier et al. | 438/197 |
| 2005/0260807 A1 * | 11/2005 | Orlowski et al. | 438/197 |
| 2009/0026552 A1 * | 1/2009 | Zhang et al. | 257/401 |
| 2009/0068810 A1 * | 3/2009 | Tsai et al. | 438/300 |
| 2009/0079004 A1 * | 3/2009 | Licitra et al. | 257/365 |

* cited by examiner

*Primary Examiner* — Jerome Jackson, Jr.
*Assistant Examiner* — Bo Fan
(74) *Attorney, Agent, or Firm* — Oliff & Berridge, PLC

(57) ABSTRACT

The field effect device comprises a sacrificial gate electrode having side walls covered by lateral spacers formed on a semiconductor material film. The source/drain electrodes are formed in the semiconductor material film and are arranged on each side of the gate electrode. A diffusion barrier element is implanted through the void left by the sacrificial gate so as to form a modified diffusion area underneath the lateral spacers. The modified diffusion area is an area where the mobility of the doping impurities is reduced compared with the source/drain electrodes.

4 Claims, 2 Drawing Sheets

FIELD EFFECT DEVICE PROVIDED WITH A LOCALIZED DOPANT DIFFUSION BARRIER AREA AND FABRICATION METHOD

BACKGROUND OF THE INVENTION

The invention relates to a field effect device.

The invention also relates to a method for fabricating such a field effect device.

STATE OF THE ART

With the continuous reduction of their dimensions, the active devices of integrated circuits, such as transistors, are becoming increasingly difficult to produce. New architectures are being implemented in order to form transistors which take account of the increasingly present parasitic physical phenomena responsible for impairment of the electric performances. In parallel with this, new integration layouts are also being set up to overcome the difficulties encountered in fabrication methods and to obtain functional devices.

The reduction of the dimensions of the transistor mainly involves a reduction of the length of the transistor, a reduction of the length of the conduction channel, i.e. a reduction of the distance separating the source and drain electrodes.

In conventional manner, the gate electrode is formed on the substrate which enables the conduction channel and the source and drain electrodes to be placed. The source and drain electrodes are subsequently formed by means of ion implantation of a doping impurity using the gate electrode as implantation mask. This technique enables self-alignment of the source and drain electrodes with respect to the gate electrode. The extent and profile of doping in the source and drain electrodes are generally obtained by means of two successive implantation steps of a first doping impurity. The first implantation is a tilted implantation with the purpose of forming a doped area underneath a part of the lateral spacers of the transistor. The second implantation step is a vertical implantation which forms highly doped areas outside the volume delineated by the gate electrode with its lateral spacers.

In order to form a high-performance transistor that is compatible with consumption and/or power requirements, it is necessary to have source/drain areas that are as highly doped as possible so as to minimize the access resistance of the transistor. It is therefore important to incorporate a large quantity of dopants in the source/drain areas, but also to perform good activation of the incorporated dopants.

Obtaining a good transistor also requires fabrication of abrupt junctions between the conduction channel and the source/drain electrodes. The more abrupt the junction, the weaker the transistor leakage current. Thus, to have a transistor presenting good consumption characteristics, i.e. with limited leakage, it is advantageous to have a non-doped channel.

As indicated in the above, the source and drain electrodes are formed by means of one or more doping impurity implantation steps. The implantation step is followed by activation/diffusion annealing which enables, a part of the defects created when implantation is performed to be cured and the greatest possible quantity of doping impurities to be placed in electrically active sites. As annealing is performed at high temperature, diffusion of the doping impurities takes place into the transistor.

In order to have high-performance transistors, it appears evident that an abrupt junction can only be obtained by means of a limited thermal budget and therefore by controlled diffusion. However, this thermal budget is imposed by the annealing equipment and by the fact that sufficient activation of the dopants and/or sufficient defect curing is sought to be achieved.

Another doping technique consists in depositing a semiconductor material by epitaxy on the source/drain areas of the transistor. The semiconductor material is deposited with a thermal budget that enables the majority of the doping impurities to be placed directly in electrically active sites. However, diffusion of the dopants from the epitaxied part to the rest of the source/drain areas has to be performed by means of diffusion annealing.

With the continuous decrease of the gate length, the effective length differences between the devices, linked to unpredictable aspects of the fabrication method, lead to increasingly marked differences of behaviour, which is problematic for satisfactory operation of the integrated circuit.

OBJECT OF THE INVENTION

It has been observed that a requirement exists to provide a field effect transistor having a better defined gate length that is more rugged when confronted with the unpredictable aspects of the fabrication method.

This requirement tends to be satisfied by means of a device which comprises:
  a substrate provided with a semiconductor material film,
  a gate electrode having side walls covered by lateral spacers,
  first and second source/drain electrodes formed in the semiconductor material film, the source/drain electrodes being arranged on each side of the gate electrode and being doped by a first doping impurity,
  a conduction channel formed in the semiconductor film and separating the first and second source/drain electrodes, the conduction channel being arranged facing the gate electrode,
  a modified diffusion area arranged in the extension of the lateral spacers and separating the conduction channel and one of the source/drain electrodes, the modified diffusion area comprising a first doping impurity diffusion barrier element, the diffusion barrier element concentrations in the conduction channel and in the source/drain electrodes being lower than the barrier element concentration in the modified diffusion area.

It is also observed that a requirement exists to provide a method for fabricating such a transistor that is easy to implement and that can preferably be easily co-integrated with electronic circuit fabrication methods.

The device is fabricated according to a method comprising the following steps:
  providing a substrate provided with a semiconductor material film covered by a sacrificial gate electrode and lateral spacers, the lateral spacers covering the side walls of the sacrificial gate electrode,
  eliminating the sacrificial gate electrode so as to form a void area bordered by the lateral spacers,
  performing tilted ion implantation of a diffusion barrier element with a non-zero angle with respect to the surface of the semiconductor material film so as to form in the semiconductor material film, through the void area, an area doped by a first doping impurity diffusion barrier element underneath the lateral spacers,
  forming a gate electrode made from electrically conducting material.

BRIEF DESCRIPTION OF THE DRAWINGS

Other advantages and features will become more clearly apparent from the following description of particular embodi- FIGS. 1 to 6 schematically represent different steps of fabrication of a device, in cross-section.

DESCRIPTION OF PREFERRED EMBODIMENTS OF THE INVENTION

Figure 1:
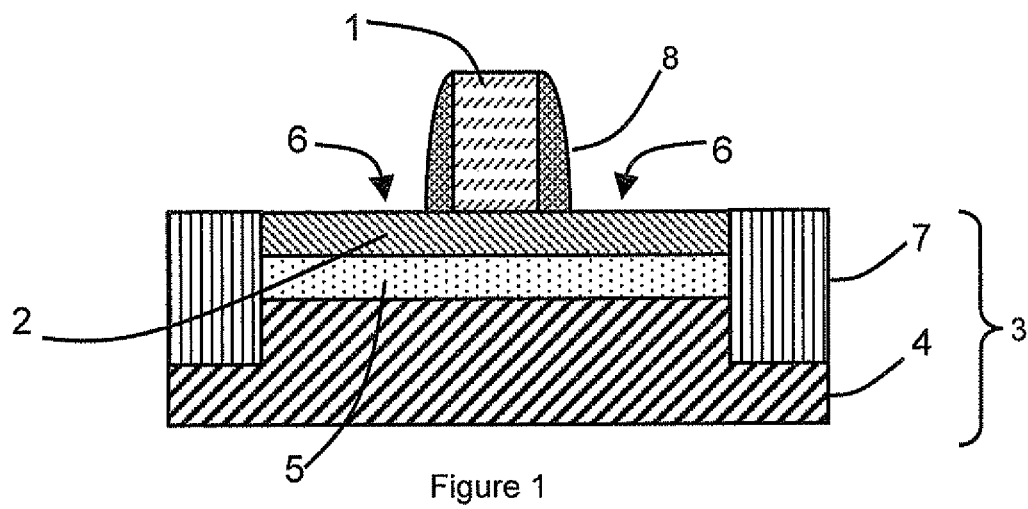

As illustrated in FIG. 1, a sacrificial gate electrode 1 is formed on a semi-conductor material film 2 of a substrate 3. Sacrificial gate electrode 1 may be separated from semiconductor material film 2 by a gate dielectric (not shown) which can be sacrificial or not.

Substrate 3 can be of semiconductor on insulator type and successively comprise a support substrate 4, an electrically insulating layer 5 and a semi-conductor material film 2. Semiconductor material film 2 is a layer called active layer as it is designed to integrate one or more field effect transistors or other devices.

Depending on the embodiments, semiconductor film 2 can be formed by a single semiconductor material or by a plurality of semiconductor films.

Substrate 3 then successively comprises support substrate 4, electrically insulating layer 5, semiconductor material film 2 and gate electrode 1.

Substrate 3 can also be a bulk substrate, for example a silicon substrate on which gate electrode 1 is formed.

Source/drain electrodes 6 or the future source/drain electrodes are arranged on each side of gate electrode 1 and separated by a conduction channel.

In a particular embodiment, an electrically insulating pattern 7 is formed in substrate 3 to define the active area of the transistor. Insulating pattern 7 enables the future transistor and source/drain electrodes 6 to be electrically insulated from the rest of substrate 3. The gate electrode advantageously extends on each of its ends above insulating pattern 7 so as to delineate the source and drain areas precisely and prevent any short-circuiting.

Sacrificial gate electrode 1 is covered on its side walls by lateral spacers 8 made from electrically insulating material. Spacers 8 are formed after sacrificial gate electrode 1 by means of conformal deposition of the electrically insulating material followed by anisotropic etching. Lateral spacers 8 enable the distance between the implantations of the intermediate areas and the edge of the gate electrode to be adjusted. They also prevent any short-circuiting between gate electrode 1 and semi-conductor film 2. The lateral spacers can be absent in the areas where gate electrode 1 is formed on insulating pattern 7. In a particular embodiment, lateral spacers 8 are in the form of a single spacer which passes right around gate electrode 1. In the cross-sectional view illustrated in FIG. 1, lateral spacers 8 separate sacrificial gate electrode 1 from source/drain areas 6.

Figure 2:
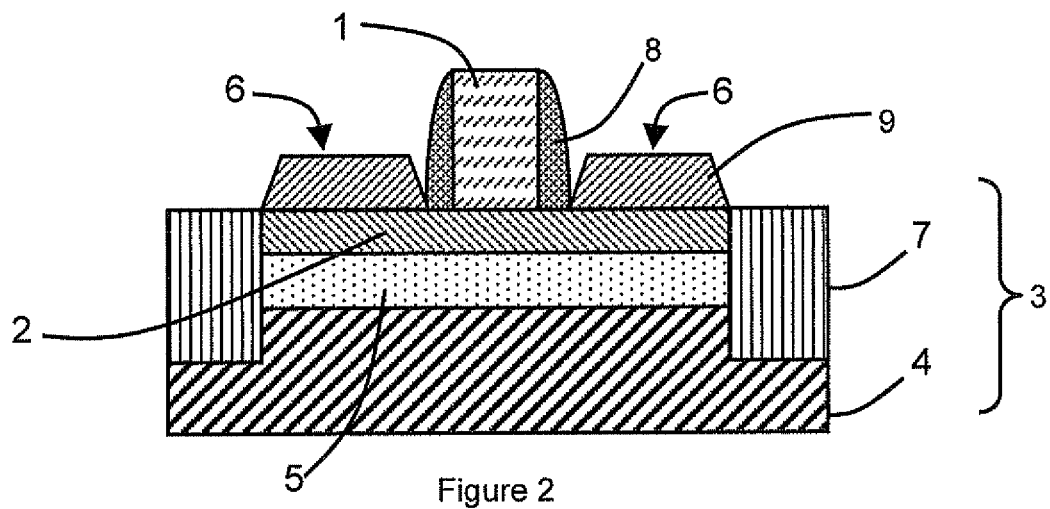

In an advantageous embodiment illustrated in FIG. 2, selective epitaxy of semiconductor material 9 is performed at the level of source and drain electrodes 6 so as to raise the surface of these electrodes 6 with respect to the position of the conduction channel and to reduce penetration of source/drain electrodes 6 into the depth of substrate 3, which enables the electric performances of the final device to be improved.

The deposited semiconductor material 9 can be identical or not to that initially forming semiconductor film 2. Semiconductor material 9 can be doped or non-doped.

In an embodiment which can be combined with the previous embodiment, a second lateral spacer (not shown) is formed on a first lateral spacer 8, preferably after the selective epitaxy step has been performed, to obtain greater room for manoeuvre in the subsequent implantation steps and/or in siliciding of electrodes 6.

At this step of fabrication, it is also possible to perform formation of the doping transition areas by means of implantation of doping impurities between the future source and drain areas 6. Implantation is performed with a predefined angle which prevents implantation perpendicular to the surface of the substrate. A certain quantity of dopants is thus implanted underneath spacers 8. The doping transition area is a doped area of semiconductor film 2 which enables direct passage from the conduction channel to source/drain areas 6 to be avoided.

The second series of lateral spacers allows to increase the surface of substrate which is masked when the implantation steps are performed, for example when implantation of the source and drain areas and/or formation of the weakly doped transition areas between source/drain electrodes 6 and the channel are performed. In this way, the doped areas of the source and drain are averted, which enables diffusion of the dopants to be performed more easily without risking short-circuiting of the channel and therefore loss of the transistor effect.

In an alternative embodiment, several successive doping transition areas can be made.

Figure 3:
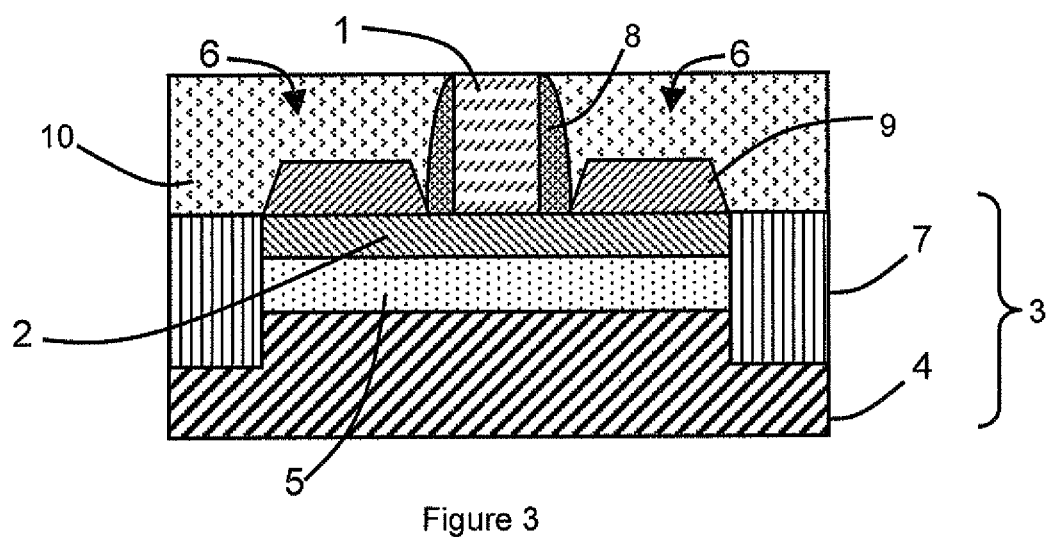
Figure 4:
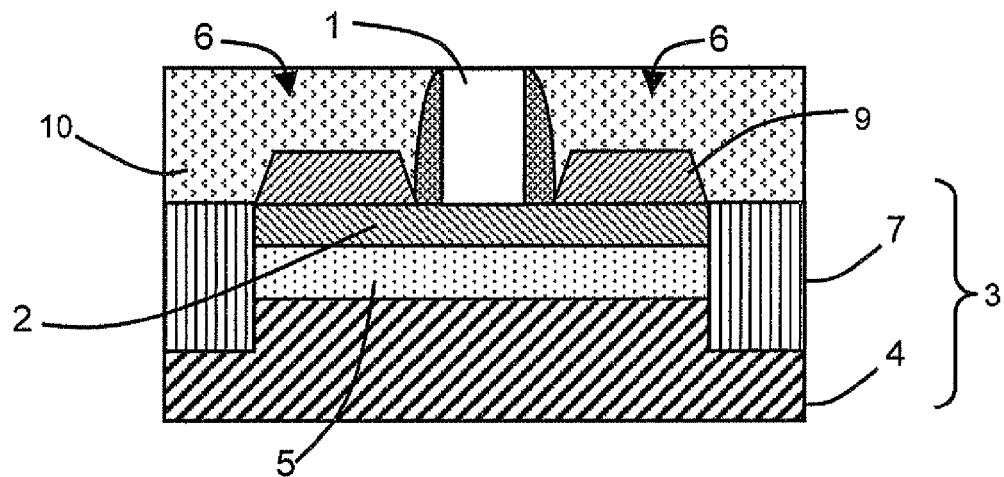

As illustrated in FIGS. 3 and 4, sacrificial gate 1 is then eliminated so as to have access to substrate 3 or to the gate dielectric at the level of the conduction channel.

In advantageous embodiment illustrated in FIG. 3, the substrate is protected to easily eliminate sacrificial gate 1 without risking damaging the other elements present on substrate 3. Once the gate has been eliminated, access can be had to the substrate or to the gate dielectric. Depending on the embodiments employed, the gate dielectric can be eliminated or kept.

In the particular embodiment illustrated in FIG. 3, a covering material 10 is deposited on the substrate so as to cover sacrificial gate 1. Covering material 10 is partly etched so as to allow access to sacrificial gate 1. In an even more particular embodiment, access to sacrificial gate 1 is obtained by means of an additional photolithography step which enables etching of covering layer 10 to be localized above sacrificial gate 1. In another example case, covering material 10 is planarized until sacrificial gate 1 is reached, for example by mechanical polishing and/or by plasma or wet etching.

These two techniques can also be combined by performing the planarizing step before localized opening by photolithography and etching. It is also possible to perform the photolithography and etching steps first so as for example to reduce the surface maskwork and to access gate 1 by planarizing.

After the gate has been eliminated, covering material 10 can be eliminated or kept.

Figure 5:
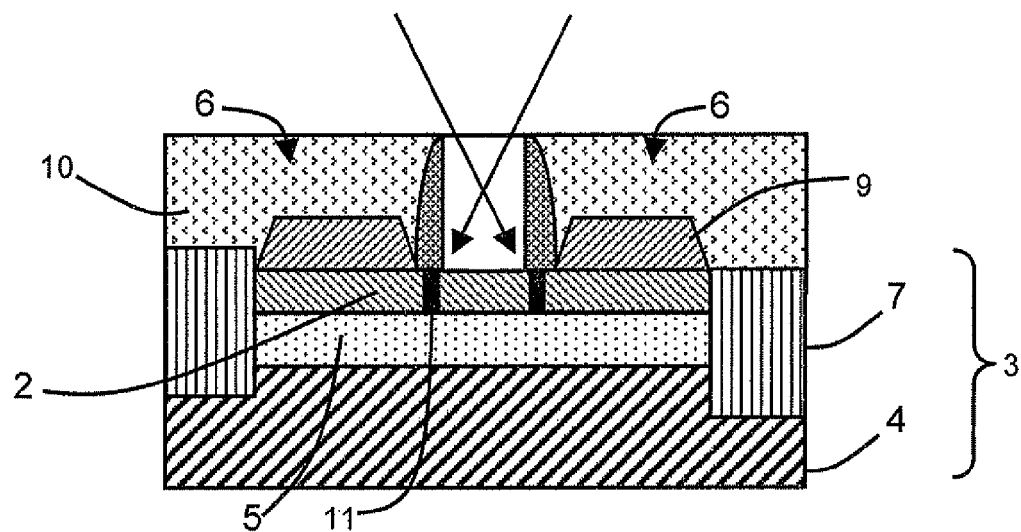
Figure 6:
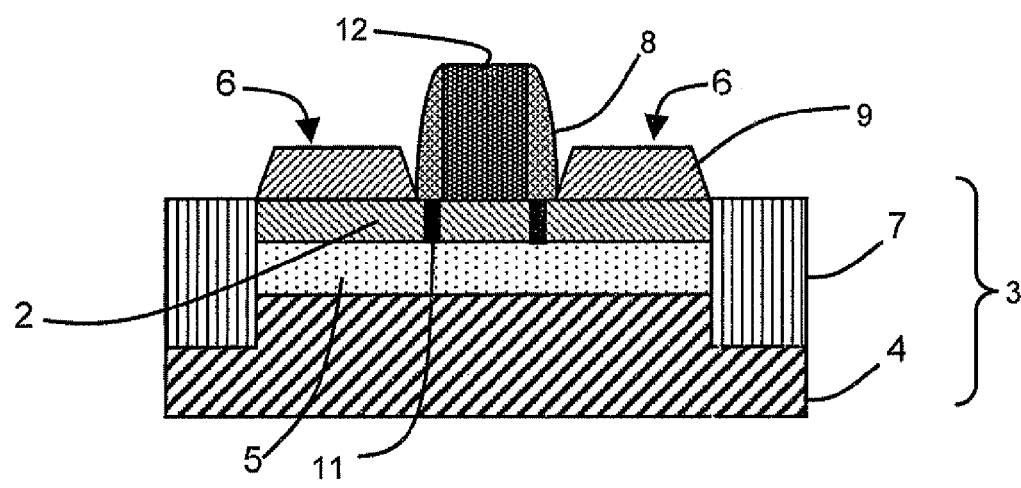

As illustrated in FIG. 5, once sacrificial gate 1 has been eliminated, a diffusion barrier material is implanted underneath spacers 8 to form modified diffusion areas 11 in semiconductor film 2. Implantation is performed through the void volume left by the sacrificial gate bordered by lateral spacers 8. The modified diffusion areas are facing spacers 8 and represent areas of semi-conductor film 2 in which the diffusion rate of certain electric impurities forming electrodes 6 is reduced compared with the diffusion rate in the channel and/or in source/drain areas 6. The limited diffusion areas are areas of semiconductor film 2 which are doped by the barrier material and which are preferably in the extension of spacers 8.

The modified diffusion areas are areas of reduced diffusion for the dopant impurities forming source/drain electrodes 6.

In this way, the dopant impurities originating from source/drain electrodes 6 encounter greater difficulties to reach the conduction channel. Furthermore, as displacement of the dopant impurities is slower in areas 11 than in the rest of film 2, the positional deviations of the source/drain electrodes that define the length of the channel are reduced. This results in the channel lengths being more homogeneous on any one substrate or from one substrate to another.

Implantation is performed tilted, i.e. implantation is performed with a different angle from the perpendicular to the surface of the substrate. Implantation is performed with a different angle from the perpendicular to the interface between the substrate and the gate electrode or the gate dielectric. The axis defining the direction of implantation joins the source electrode to the drain electrode and is preferably perpendicular to the width of the gate so as to prevent parasitic contamination of the channel. The implantation axis is included here in the illustrated cross-sectional plane.

The tilt angle when implantation is performed is chosen such as to localize the diffusion barrier material underneath the spacers and therefore at the interface between the channel and the doped areas forming drain and source electrodes 6.

The implantation angle is chosen such as to leave a central part of the conduction channel devoid of diffusion barrier element enabling a channel area with a high mobility to be had.

Modified diffusion areas 11 are located at the interface between the conduction channel and source and drain electrodes 6. The channel is a volume of semiconductor material 2 that is not doped or is weakly doped (by electrically active impurities) and arranged underneath the gate electrode. Source/drain electrodes 6 are volumes doped by the first doping impurity, arranged on each side of the gate electrode and which penetrate slightly beneath lateral spacers 8.

In even more preferential manner, modified diffusion areas 11 are in the extension of spacers 8 and preferably have a width that is smaller than that of the spacers. Modified diffusion area 11 does not extend beyond the spacers, which enables the influence of the barrier material on the mobility of the channel and on activation of the dopants in electrodes 6 to be reduced.

Advantageously, the implantation angle is chosen sufficiently different from the perpendicular to the substrate so as not to implant barrier material in the channel delineated by the former gate 1. However, the deviation from the perpendicular with semiconductor material 2 is sufficiently small for a part of the barrier material to be implanted in the semiconductor material underneath spacers 8. Formation of two modified diffusion areas 11 that are separated by the conduction channel devoid of barrier material takes place in semi-conductor film 2.

The implantation angle is defined according to the dimensions of the hole or of the trench allowing access to the substrate through the volume of sacrificial gate 1.

In the example illustrated in FIG. 5, the implantation angle is defined according to the dimensions of the former gate 1, i.e. according to the height of spacers 8 and the length of gate 1 (the distance separating the two spacers 8). In this embodiment, the height of the gate in fact corresponds to the height of the spacers and to the height of covering material 10. The tangent of the maximum implantation angle is equal to the ratio between the gate length and the height of spacers 8. Beyond this value, the diffusion barrier material is not able to reach substrate 3. The tangent of the minimum implantation angle is equal to the ratio between the gate half-length and the height of the sacrificial gate. With an implantation angle equal to or smaller than this value, the whole of the channel is implanted with the barrier material and the electric performances are reduced.

In the case where access to the gate electrode was achieved by forming a hole in covering material 10 which is then thicker than the gate electrode and spacers 8, the length of the opening of the hole and the height of covering material 10 have to be taken into account to find the appropriate angle.

In advantageous manner, implantation of the barrier material is performed with an angle equal to or very slightly smaller than the maximum implantation angle.

As the maximum implantation angle is a function of the dimensions of sacrificial gate 1 (FIG. 5), it is advantageous to perform one implantation step per gate dimension in order to have the best operating conditions for each transistor length.

By performing implantation of the barrier material through the void area of former sacrificial gate 1, modified diffusion areas 11 can be placed in immediate proximity to the channel. The channel (devoid of barrier material) is separated from source/drain electrodes 6 by a modified diffusion area 11. This also enables a lower implantation energy and easier operating conditions to be used in comparison with implantation, from outside the gate to define a channel of the same length.

When the thermal anneals are performed, modified diffusion area 11 prevents diffusion of the doping impurities up to the channel. It is then possible to have transistors with a small gate length while taking advantage of the restraining effect of areas 11 which prevent short-circuiting of the transistor.

The barrier material is a material that restrains or reduces diffusion of the doping atoms used to form source and drain areas 6 and/or doping transition areas. The device is thus more rugged to stand up to unpredictables of the fabrication process on the thermal balances, which avoids having a too large fluctuation on the electric length of the gate (the distance separating two doped areas and which is generally smaller than the physical length of the gate).

In an advantageous embodiment, the barrier material is carbon as it has an effect on the diffusion kinetics of boron and phosphorus which are used to form the doped areas of nMOS or pMOS transistors. Other materials can however be used such as for example nitrogen or oxygen. It is also possible to dissociate the barrier material used for nMOS transistors and that used for pMOS transistors. There is then a first implantation step with a first barrier material for a first type of transistor and a second implantation step with a second barrier material for a second type of transistors. This dissociation enables different materials or the same material to be implanted, but at different concentrations.

After implantation of the barrier material, the substrate is preferably subjected to activation annealing to place the barrier material in a substitutional position and make it more efficient on diffusion of the dopants.

In advantageous manner, source/drain areas 6 are protected during the barrier material implantation step so as to prevent restraining of the dopant material in the source/drain electrodes. Protection is preferably performed by covering material 10 which served the purpose of protecting substrate 3 to access sacrificial gate 1.

In a preferred embodiment, the source/drain electrodes are not protected when selective epitaxy was performed. In this way, the top surface of the source/drain electrodes is higher than the top surface of the conduction channel. When implantation of the barrier material is performed, the latter is localized in the top part of source/drain electrodes 6. This top part can if required be eliminated in order to keep source/drain electrodes without barrier material. The barrier material is then localized in the top part of source/drain areas 6 whereas the first doping impurity is implanted at a greater depth.

Once the barrier material has been implanted underneath lateral spacers 8, a new gate 12 is formed in the area left void by the sacrificial gate. Gate electrode 12 is separated from substrate 3 by a gate dielectric material, which is an electrically insulating material, for example silicon oxide, silicon nitride, or a material presenting a higher dielectric constant such as hafnium oxide.

The remainder of the fabrication method can be performed in conventional manner as the transistor comprises a gate electrode 12 separating two source/drain electrodes.

In preferential manner, if source and drain electrodes 6 are formed by ion implantation, the doping impurity is implanted in a different area from area 11 so as to prevent non-activation problems of the doping impurity due to the barrier material. This geographical distinction is easy to implement as the implantations are performed separately in the integration layout presented. Barrier material implantation is performed by passing inside the gate electrode whereas doping impurity implantations are performed by passing outside the gate electrode.

The transistor conventionally presents a conduction channel separating source/drain electrodes 6. The interface between the source/drain electrodes and the channel is preferably formed in modified diffusion areas 11 which reduces the influence of the barrier material on activation of the doping impurities and on the mobility of the channel.

The fabrication method is for example performed in the following manner. After gate electrode 12 has been formed, covering material 10 is eliminated and a doped insulating material is deposited. The doped insulating material is for example a glass doped with boron or phosphorus (of BSG or PSG type) or a dielectric material deposited by spin-coating.

Diffusion annealing is then performed to make the dopants migrate from the doped insulating material to source and drain electrodes 6. The doped insulating material provides a large quantity of dopants in source and drain areas 6, and diffusion barrier 11 prevents the dopants originating from source/drain electrodes 6 from joining up in the channel. It is then possible to obtain highly doped source/drain electrodes 6 while preserving a channel area that is only slightly doped or is not doped, while at the same time taking advantage of the large effect of diffusion barrier 11 arranged underneath the lateral spacers.

The doped insulating material is then eliminated and the source/drain electrodes are silicided.

The barrier material enables areas presenting different diffusion rates to be formed in the semiconductor film along an axis joining the source electrode to the drain electrode. Two areas having a high diffusion rate are separated by an area with a lower diffusion rate comprising the barrier material. The source/drain electrodes present a high diffusion rate as they are devoid of barrier material. The absence of barrier material enables a good distribution of the dopants and good activation of dopants to be achieved, which is favorable to a weak access resistance. This also makes it possible to have conventional dopant profiles with a limited thermal budget which is not possible when the barrier material prevents or limits diffusion of the dopants in source/drain electrodes 6.

In the embodiment described above, a limited diffusion area is formed between the channel and source and between the channel and drain. It is however possible to only form the limited diffusion area between the channel and one of electrodes 6. This embodiment enables less good control of the gate length to be achieved as only one side presents a limited diffusion rate. This embodiment can be achieved simply by implanting the barrier material on one side of the channel only, whereas in the case illustrated in FIG. 3, implantation is performed on both sides. This also enables areas 11 with different surface areas and/or concentrations to be formed between the source and drain.

In a preferred embodiment, two transistors are made on the substrate. The first transistor is made with a smaller size than the second transistor, i.e. the gate length (the distance separating the source electrode and drain electrode) of the first transistor is smaller than the gate length of the second transistor. In an alternative embodiment, the first and second transistors are of opposite type (an nMOS transistor and a pMOS transistor).

As the two transistors are subjected to the same thermal budget or have a part of the thermal budget in common, it is important not to short-circuit one of the transistors when proceeding to form the other transistor.

In order to make the first transistor more rugged with respect to the thermal budget necessary for the second transistor, the first transistor comprises implantation of the barrier material underneath the lateral spacers. In this way, by modifying the diffusion rate of the dopants along a line passing via the channel and connecting the two source and drain electrodes, it is possible to virtually increase the distance that separates the two source/drain electrodes. In this case, the second transistor does not present any modified diffusion areas. In a particular embodiment, the sacrificial gate of the first transistor is also a sacrificial gate for the second transistor. Sacrificial gate 1 of the second transistor is kept during implantation of the barrier material and is then eliminated to form gate 12.

In another embodiment, sacrificial gate 1 of the first transistor corresponds to the definitive gate of the second transistor.

For example purposes, for a gate having a length equal to 20 nm and a height equal to 80 nm, the preferred implantation angle is equal to 15°. Under these conditions, lateral spacers 6 have a large shadowing effect when implantation is performed, which enables barrier material to be implanted over 1.5 nm under spacers 6 on each side of the channel. When the diffusion annealing step is performed, the dopants therefore have to pass through 1.5 nm of reduced diffusion area to reach the conduction channel.

This architecture and this fabrication method are particularly interesting in an integration with a substrate of semiconductor on insulator type. In preferential manner, modified diffusion area 11 connects spacer 8 to electrically insulating layer 5, i.e. it occupies the whole of the thickness of semiconductor film 2, which enables the length of the channel to be completely controlled over the whole of its thickness.

The invention claimed is:

1. A field effect device comprising:
   a substrate successively including a support substrate, an electrically insulating layer and a semiconductor film;
   a gate electrode having side walls covered by lateral spacers;
   a source electrode and a drain electrode formed in the semiconductor material film, the source and drain electrodes being arranged on each side of the gate electrode and doped by a first doping impurity;
   a conduction channel formed in the semiconductor film and separating the source and drain electrodes formed in the semiconductor material film, the conduction channel being arranged facing the gate electrode; and
   a modified diffusion area is arranged in the extension of one of the lateral spacers according to a first direction that is perpendicular to an interface between the one of the lateral spacers and the semiconductor film so as to connect the electrically insulating layer to the associated lateral spacer and to separate the conduction channel and one of the source and drain electrodes, wherein a diffusion barrier element for the first doping impurity is introduced into the modified diffusion area and concentrations of the diffusion barrier element in the conduction channel and in one of the source and drain electrodes are smaller than the concentration of the diffusion barrier element in the modified diffusion area.

2. The device according to claim 1, wherein a lateral extent of the modified diffusion area is smaller than a lateral extent of the associated lateral spacer according to a second direction linking the source electrode to the drain electrode.

3. The device according to claim 1, wherein the source and drain electrodes are each separated from the channel by one modified diffusion area arranged in the extension of the lateral spacers.

4. The device according to claim 1, wherein the conduction channel is superimposed on the electrically insulating layer and disposed between modified diffusion areas with the gate electrode on top of the conduction channel.

* * * * *